United States Patent
Wang et al.

(10) Patent No.: US 11,754,637 B2
(45) Date of Patent: Sep. 12, 2023

(54) POWER SYSTEM COMPONENT TESTING USING A POWER SYSTEM EMULATOR-BASED TESTING APPARATUS

(71) Applicant: University of Tennessee Research Foundation, Knoxville, TN (US)

(72) Inventors: Fei Wang, Knoxville, TN (US);
Jingxin Wang, Knoxville, TN (US);
Yiwei Ma, Knoxville, TN (US)

(73) Assignee: University of Tennessee Research Foundation, Knoxville, TN (US)

( * ) Notice: Subject to any disclaimer, the term of this patent is extended or adjusted under 35 U.S.C. 154(b) by 262 days.

(21) Appl. No.: 17/197,147

(22) Filed: Mar. 10, 2021

(65) Prior Publication Data

US 2022/0291293 A1    Sep. 15, 2022

(51) Int. Cl.
| | |
|---|---|
| *G01R 31/40* | (2020.01) |
| *G01R 31/42* | (2006.01) |
| *G01R 31/317* | (2006.01) |
| *G01R 31/30* | (2006.01) |
| *G01R 31/52* | (2020.01) |
| *G01R 31/34* | (2020.01) |

(52) U.S. Cl.
CPC ......... *G01R 31/42* (2013.01); *G01R 31/3004* (2013.01); *G01R 31/31721* (2013.01); *G01R 31/40* (2013.01); *G01R 31/343* (2013.01); *G01R 31/52* (2020.01)

(58) Field of Classification Search
CPC .. G01R 31/42; G01R 31/40; G01R 31/31721; G01R 31/3004; G01R 31/52; G01R 31/343; H02J 3/00; Y04S 40/20
USPC ......... 324/71, 378, 403, 415, 425, 500, 537, 324/764.01
See application file for complete search history.

(56) References Cited

U.S. PATENT DOCUMENTS

| | | | |
|---|---|---|---|
| 5,644,515 | A  | 7/1997  | Sample |
| 6,885,915 | B2 | 4/2005  | Rehtanz |
| 7,765,497 | B2 | 7/2010  | Cheng |
| 8,434,027 | B2 | 4/2013  | Jones |
| 10,873,184 | B2 | 12/2020 | Wang et al. |
| 10,965,124 | B2 | 3/2021  | Laval et al. |
| 11,183,991 | B2 | 11/2021 | Stroh |

(Continued)

OTHER PUBLICATIONS

Jiminez et al., Analysis of Reconfigurable Tap Changing Transformer Model Through Analog Emulation, IEEE 2009.

*Primary Examiner* — Raul J Rios Russo
(74) *Attorney, Agent, or Firm* — Stanek Lemon Crouse & Meeks, P.A.

(57) ABSTRACT

An apparatus for testing components for use in a power system includes at least one power amplifier circuit configured to be coupled to the component and a control circuit configured to operate the power amplifier circuit responsive to at least one state of a component emulator for the component included in a system emulator for the power system. The component emulator may include at least one power electronics converter circuit and the control circuit may be configured to control at least one of a voltage and a current of the at least one power amplifier circuit responsive to at least one of a voltage and a current of the at least one power electronics converter circuit. The control circuit may be further configured to control the component emulator responsive to at least one state of the at least one power amplifier circuit.

11 Claims, 8 Drawing Sheets

(56) References Cited

U.S. PATENT DOCUMENTS

| | | | |
|---|---|---|---|
| 2008/0204131 A1* | 8/2008 | Roberts | H03F 1/327 |
| | | | 330/3 |
| 2010/0085783 A1 | 4/2010 | Jiang-Hafner | |
| 2010/0332211 A1 | 12/2010 | Oudalov et al. | |
| 2012/0105072 A1* | 5/2012 | Peterson | G01R 31/42 |
| | | | 324/511 |
| 2013/0258732 A1* | 10/2013 | Zhu | H02S 50/10 |
| | | | 363/95 |
| 2016/0248341 A1 | 8/2016 | Trainer et al. | |
| 2016/0252579 A1* | 9/2016 | Kondo | H01C 13/02 |
| | | | 324/764.01 |
| 2017/0346677 A1 | 11/2017 | Suryanarayana | |
| 2018/0024204 A1* | 1/2018 | Novak | G01R 13/20 |
| | | | 324/764.01 |
| 2018/0115164 A1 | 4/2018 | Gupta et al. | |
| 2018/0204138 A1 | 7/2018 | Nugent | |
| 2018/0336075 A1 | 11/2018 | Cairns | |
| 2019/0109891 A1 | 4/2019 | Paruchuri | |
| 2022/0229406 A1 | 7/2022 | Wang et al. | |

\* cited by examiner

POWER SYSTEM COMPONENT TESTING USING A POWER SYSTEM EMULATOR-BASED TESTING APPARATUS

STATEMENT OF GOVERNMENT INTEREST

The invention was made with government support under Award Number EEC-1041877 awarded by the National Science Foundation. The government has certain rights in the invention.

BACKGROUND

The inventive subject matter relates to apparatus and methods for analysis of electrical power systems and, more particularly, to apparatus and methods for emulating electrical power systems.

The design and operation of electrical power systems (e.g., utility grids) commonly involves simulation and/or emulation using tools such as digital simulators, analog hardware emulators, or mixed digital-analog signal emulator. Computer-implemented simulation can provide advantages, such as relatively low cost and reconfigurability, but software-based simulators may have difficulty dealing with multi timescale models and may suffer from numerical stability and convergence issues. Analog hardware-based emulators can provide advantages such as realism, actual communication and sensors, and that ability to reveal the impact of the aspects that may be overlooked by digital simulation, such as delay, measurement errors, and electromagnetic interference. However, such emulators can be bulky and inflexible and may exhibit model fidelity issues when scaled. Mixed digital-analog signal emulators, such as described in U.S. Patent Application Publication No. 2010/0332211, are more flexible compared to scaled analog hardware-based emulators; however, they also may exhibit model fidelity issues especially with their unscalable line emulation method.

Emulators that utilize power electronics-based converters have been proposed in, for example, U.S. Pat. No. 10,873,184 to Wang et al. Such systems can provide more realistic behavior comparison to digital simulation and may be more flexible than other hardware-based platforms. However, these emulators are not software configurable and have limited scalability as prior mixed digital-analog signal emulators.

SUMMARY

Some embodiments of the inventive subject matter provide apparatus for testing components for use in a power system. In some embodiments, an apparatus includes at least one power amplifier circuit configured to be coupled to the component and a control circuit configured to operate the power amplifier circuit responsive to at least one state of a component emulator for the component included in a system emulator for the power system. In some embodiments, the component emulator may include at least one power electronics converter circuit. The control circuit may be configured to control at least one of a voltage and a current of the at least one power amplifier circuit responsive to at least one of a voltage and a current of the at least one power electronics converter circuit. The component may include a multi-port component and the at least one power electronics converter circuit may include at least two power electronics converter circuits.

According to further embodiments, the control circuit may be configured to control the component emulator responsive to at least one state of the at least one power amplifier circuit. The component emulator may include at least one power electronics converter circuit. The control circuit may be configured to control at least one of a voltage and a current of the at least one power electronics converter circuit responsive to at least one of a voltage and a current of the at least one power amplifier circuit.

In some embodiments, the component emulator may include a first component emulator circuit and the apparatus may further include at least one second component emulator circuit electrically coupled to the first component emulator circuit. The first component emulator circuit and the at least one second component emulator circuit may be included in power system emulator that includes a plurality of electrically interconnected component emulator circuits.

Still further embodiments provide methods of testing a component for use in a power system. The methods include coupling at least one power amplifier circuit to the component and operating the power amplifier circuit responsive to at least one state of a component emulator for the component included in a system emulator for the power system. The methods may further include controlling the component emulator responsive to at least one state of the at least one power amplifier circuit.

DETAILED DESCRIPTION

Figure 1:
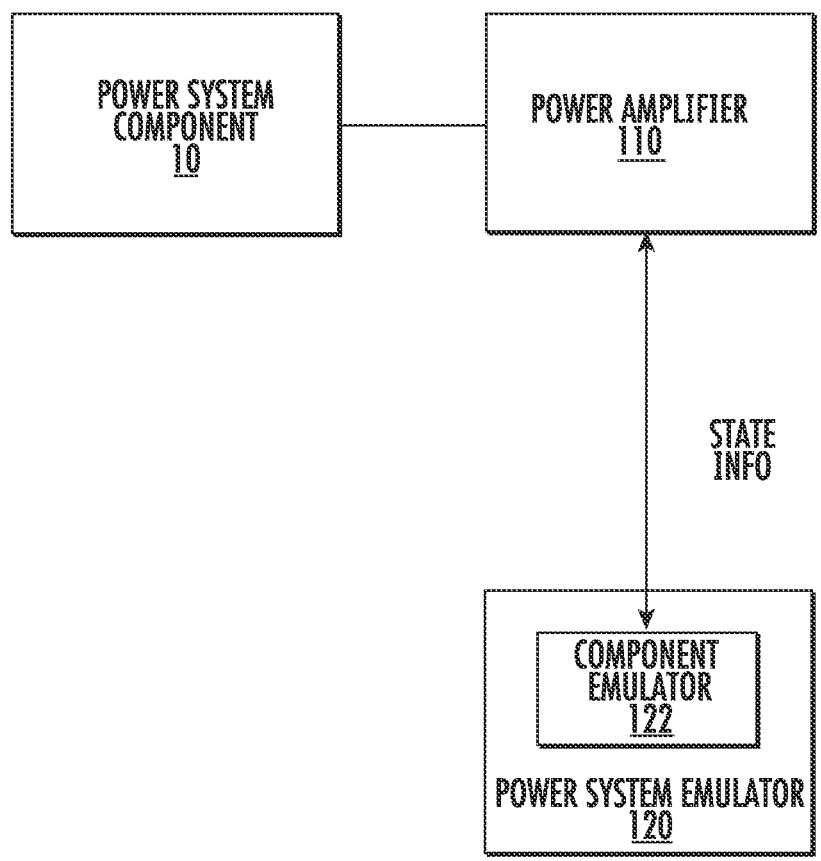
FIG. 1 illustrates an emulator-based test apparatus according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Some embodiments of the inventive subject matter provide emulator-based testing apparatus and methods that utilize power electronics converters to test power system components by exchanging data, e.g., voltage and current data, with a corresponding component emulator that is included in an emulation system that emulates a power system in which the component may be operated. Such power electronics converter based testing apparatus and methods can test a power system component at a rated or other desired operating condition. In some embodiments, apparatus and methods may use a component emulator that comprises one or more power electronics converter circuits that are used to emulate components such as power sources/load (e.g., generators, PV sources, distributed energy storage devices, etc.) and transmission components (e.g., transformers, converters, etc.). Compared to existing power system component testing methods that may use a power amplifier circuit to link a digital simulator to a power system component to be tested, power system component testing according to some embodiments uses a power system emulator based testing apparatus which uses a power amplifier circuit to link an analog power system emulator to power system component to be tested. Such an approach can provide greater test fidelity with little or no numerical stability and convergence issues.

FIG. 1 illustrates a test apparatus according to some embodiments of the inventive subject matter. The apparatus includes a power system emulator 120, which is configured to emulate operation of an electric power system that includes a plurality of electrically interconnected components, such as generators, loads, energy storage devices, transmission lines, transformers and the like. The power system emulator 120 includes a component emulator 122, which may emulate performance of a component of the power system being emulated. As explained in further detail below, the power system emulator 120 may include a plurality of interconnectable power electronics converter based component emulator circuits, with the component emulator 122 comprising one or more of such component emulator circuits.

As further illustrated, the test apparatus further includes a power amplifier circuit 110 that is configured to be coupled to a power system component 10, i.e., an actual instance of the component being emulated by the component emulator 122. The power amplifier circuit 110 and the component emulator 122 are configured to exchange state information, such as information relating to terminal voltages and currents of the power amplifier circuit 110 and the component emulator 122. Based on the state information (e.g., information relating to terminal voltage) for the component emulator 122, the power amplifier circuit 110 may impose conditions on the system component 10, such that the power system component 10 operates as if it were operating in the system emulated by the power system emulator 120. This arrangement can support hardware-in-the-loop testing of the system component 10, i.e., the system emulator 120 can be operated to emulate conditions that the system component 10 might experience in an actual electrical power system, allowing for testing of the system component 10 under various emulated power system conditions.

Figure 2:
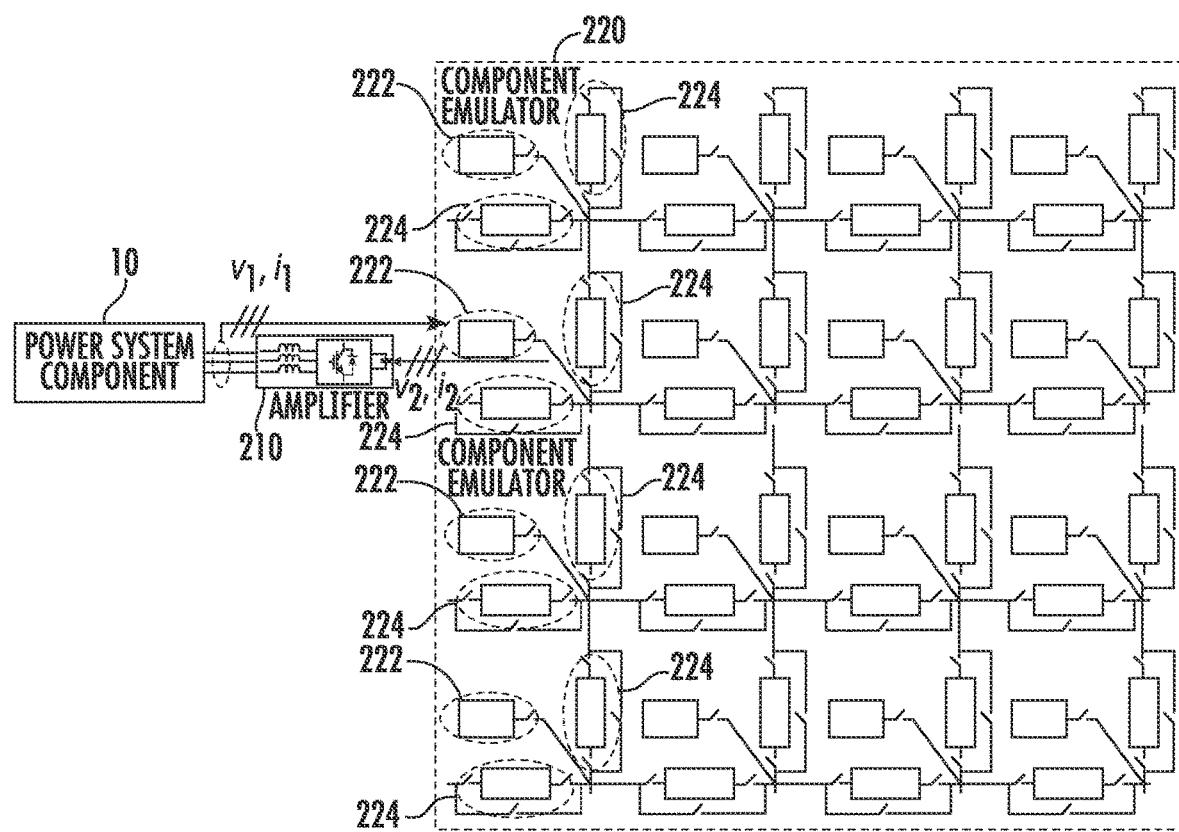
FIG. 2 is a schematic diagram illustrating a test apparatus using a power electronics converter based emulator system according to some embodiments.

FIG. 2 illustrates an example implementation of such an arrangement. A power system emulator 220 includes a plurality of electrically interconnected component emulator circuits, including single-port emulator circuits 222, which may be used to emulate power system components such as sources and loads, and multi-port component emulator circuits 224, which may be used to emulate transmission path components, such as transmission lines, converters, and transformers. Examples of component emulator circuits along these lines are described, for example, in U.S. Pat. No. 10,873,184 (assigned to the assignee of the present application) and in co-pending U.S. patent application Ser. No. 17/150,650 entitled "SCALABLE AND RECONFIGURABLE APPARATUS AND METHODS FOR ELECTRIC POWER SYSTEM EMULATION" and U.S. patent application Ser. No. 17/150,567 entitled "POWER ELECTRONICS CONVERTER BASED TRANSFORMER EMULATOR", each filed Jan. 15, 2021 and each incorporated herein by reference in its entirety.

A power amplifier circuit 210 is configured to be coupled to a system component 10 and communicates with at least one of the component emulator circuits 222, 224 of the power system emulator 220. The power amplifier circuit 210 and the component emulator circuit 222, 224 are configured to exchange current and voltage information $v_1$, $i_1$, $v_2$, $i_2$ to enable the power amplifier circuit 210 to impose conditions on the system component 10 that mimic those experienced by the component emulator circuit 222, 224 and to enable the component emulator circuit 222, 224 to respond to the imposed conditions in manner that emulates the component 10. According to some embodiments, the component emulator circuits 222, 224 can be used to implement hardware-in-the-loop testing of a power system component 10 via data exchanges with a power amplifier circuit 210 coupled to the power system component, along the lines described above.

Figure 3:
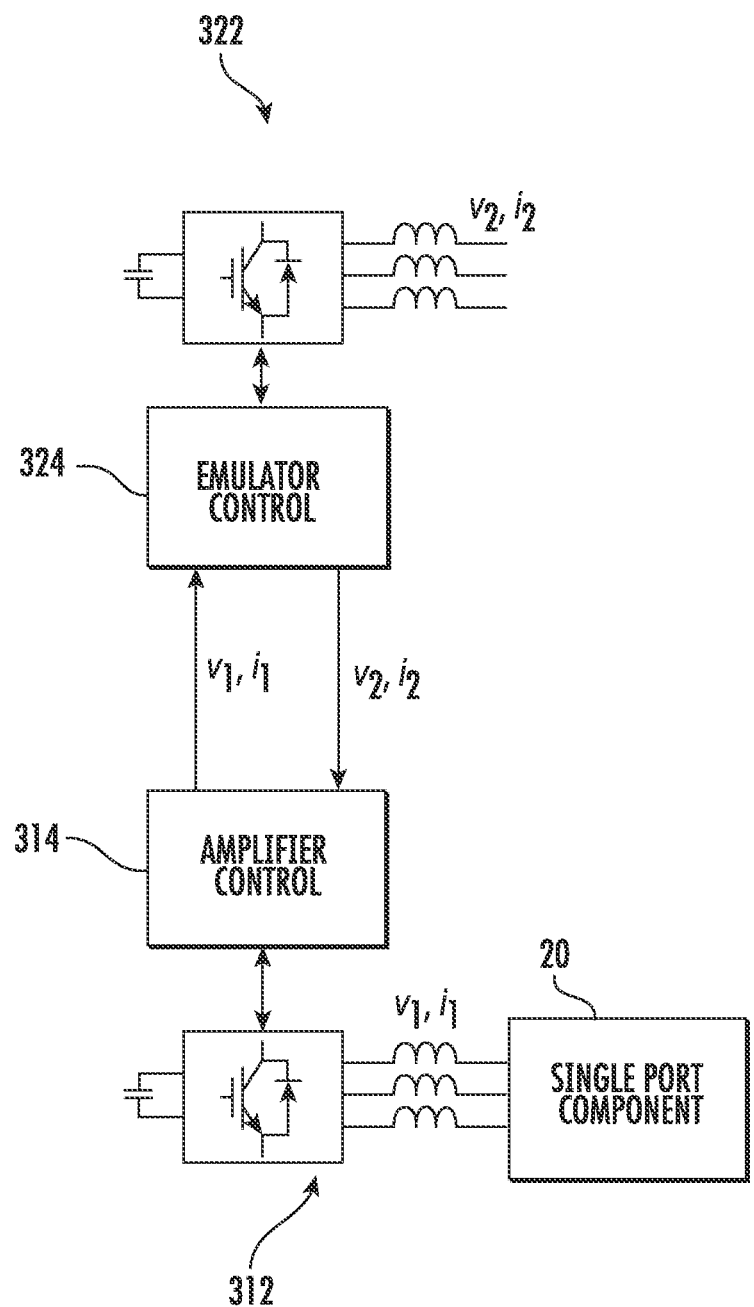
FIG. 3 is a schematic diagram illustrating an emulator-based test apparatus for a single-port power system component according to further embodiments.

Referring to FIG. 3, a single-port component emulator circuit may comprise a power electronics converter circuit 322 that is configured to emulate a single-port component, such as a source/load component 20 (e.g., a generator, energy storage device, or the like). An emulator control circuit 324 (e.g., a microcontroller-based control circuit) is configured to control the power electronics converter circuit 322 responsive to state information, such as voltage and current information $v_1$, $i_1$ received from an amplifier control circuit 314 that controls a power electronics converter circuit 312 that is connected to the source/load component 20. The amplifier control circuit 314 may also be configured to receive state information, such as voltage and current information $v_2$, $i_2$, from the emulator control circuit 324.

Figure 4:
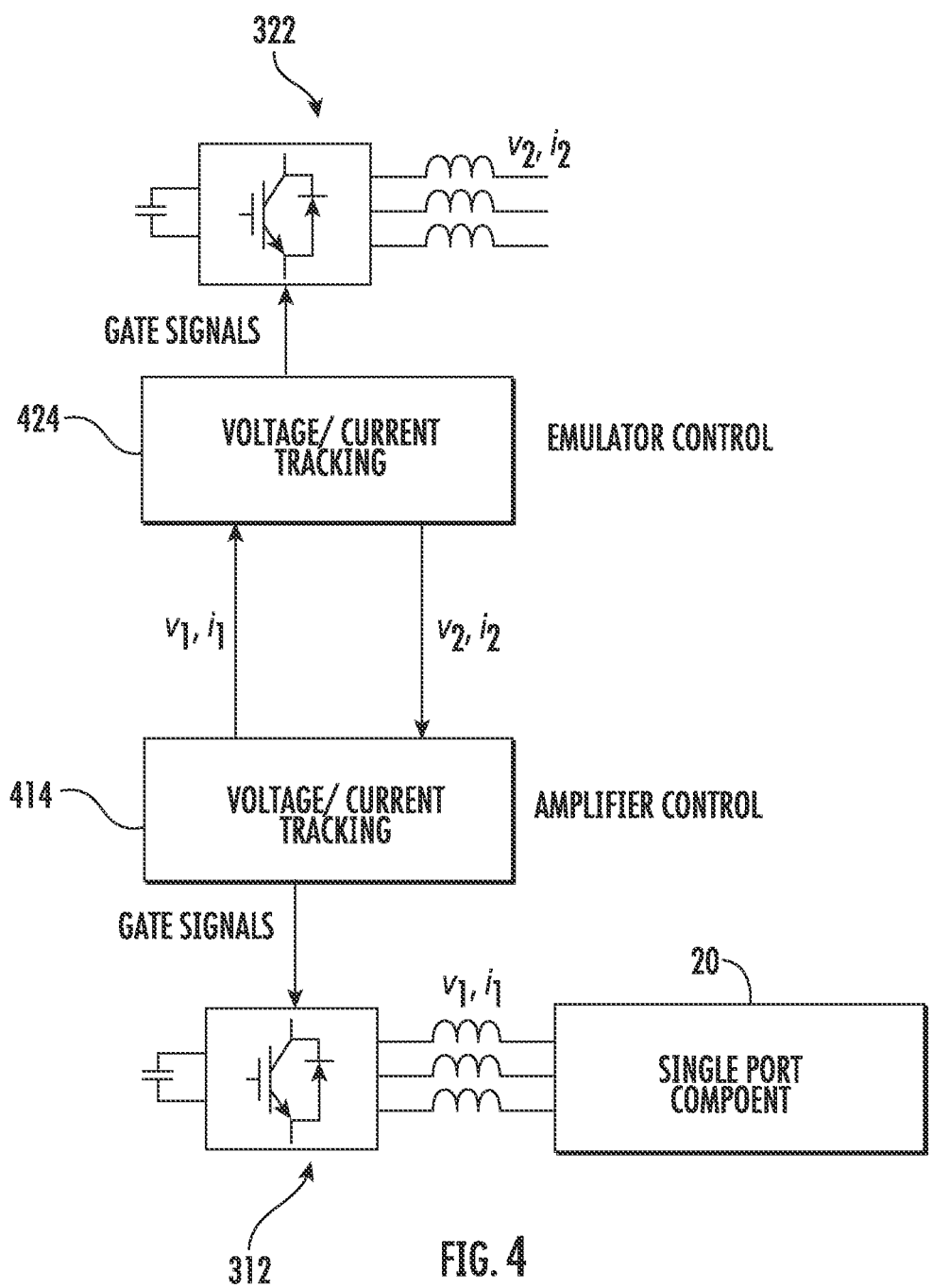
FIG. 4 is a schematic diagram illustrating a control architecture for the test apparatus of FIG. 3 according to some embodiments.

FIG. 4 illustrates an example of a control architecture for implementing such an arrangement. A component emulator control circuit 424 may receive voltage and current signals $v_1$, $i_1$ representing states of a power amplifier circuit 312 connected to a single-port component 20. The component emulator control circuit 424 may implement a voltage/current tracking function that controls the component emulator circuit 322 responsive to the voltage and current signals $v_1$, $i_1$. For example, as explained in the aforementioned U.S. patent application Ser. No. 17/150,650, a component emulator circuit 322 may include one or more switch-mode converter circuits, and the component emulator control circuit 424 may generate gate signals to control transistors of these one or more switch-mode converter circuits of the component emulator circuit 322. It will be appreciated that the voltage/current tracking function may be implemented using, for example, an analog and/or digital closed-loop controller that compares the voltage or current being tracked to the voltage or current being controlled, with appropriate scaling.

As further illustrated, an amplifier control circuit 414 may receive voltage and current signals $v_2$, $i_2$ representing states of the component emulator circuit 322. A voltage/current tracking function implemented by the amplifier control circuit 414 may control the amplifier circuit 312 responsive to these signals. For example, similar to the component emulator circuit 322, the amplifier circuit 312 may include one or more switch-mode amplifier circuits and the amplifier control circuit 414 may generate gate signals to control transistors of these one or more switch-mode amplifier circuits of the amplifier circuit 312. It will be appreciated that the voltage/current tracking function may be implemented using, for example, an analog and/or digital closed-loop controller that compares the voltage or current being tracked to the voltage or current being controlled, with appropriate scaling.

Figure 5:
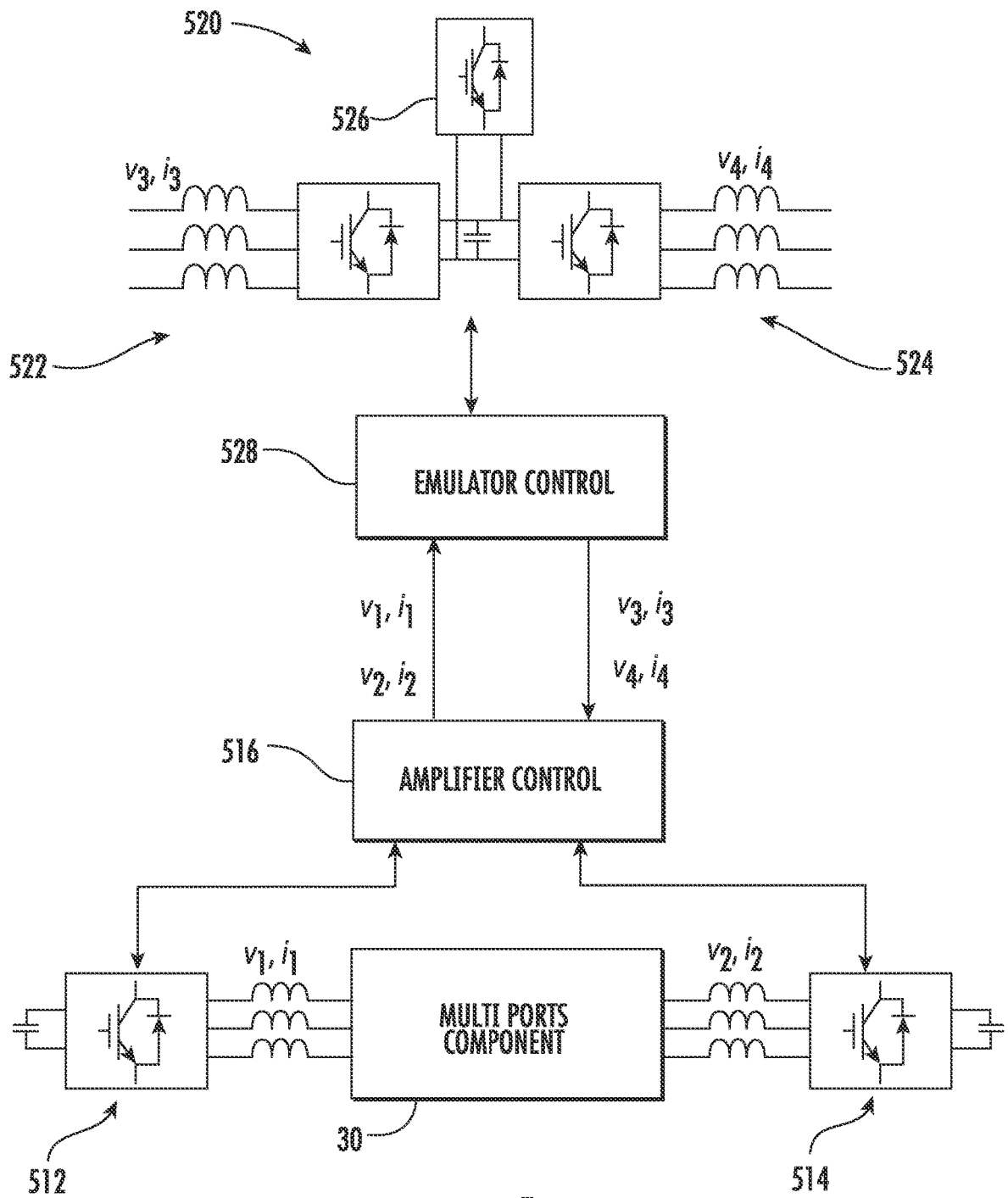
FIG. 5 is a schematic diagram illustrating an emulator-based test apparatus for a multi-port power system component according to further embodiments.

According to further embodiments, a similar approach may be used for multi-port components. Referring to FIG. 5, a multi-port system component 30, such as a transformer, power converter, or the like, may be coupled to first and second power electronics amplifier circuits 512, 514 that control terminal conditions of the component 30. An amplifier control circuit 516 operates the first and second power electronics amplifier circuits 512, 514 responsive to state information, such as voltage and current information $v_3$, $i_3$, $v_4$, $i_4$ received from a component emulator control circuit 528 that controls a component emulator circuit 520, such as the component emulator circuits described in the aforementioned co-pending U.S. patent application Ser. No. 17/150,650 and U.S. patent application Ser. No. 17/150,567. For example, the amplifier control circuit 516 may generate gate signals to control transistors of switch-mode amplifier circuits of the first and second power electronics amplifier circuits 512, 514 responsive to the voltage and current information $v_3$, $i_3$, $v_4$, $i_4$. The component emulator circuit 520 includes ports corresponding to the ports of the system component 30 and includes first, second and third converter circuits 522, 524, 526. The component emulator control circuit 528 controls the component emulator circuit 520 responsive to state information, such voltage and current information $v_1$, $i_1$, $v_2$, $i_2$ received from the amplifier control circuit 516. For example, the component emulator control circuit 528 may generate gate signals to control transistors of switch-mode converter circuits of the component emulator circuit 520 responsive to the voltage and current information $v_1$, $i_1$, $v_2$, $i_2$.

Figure 6:
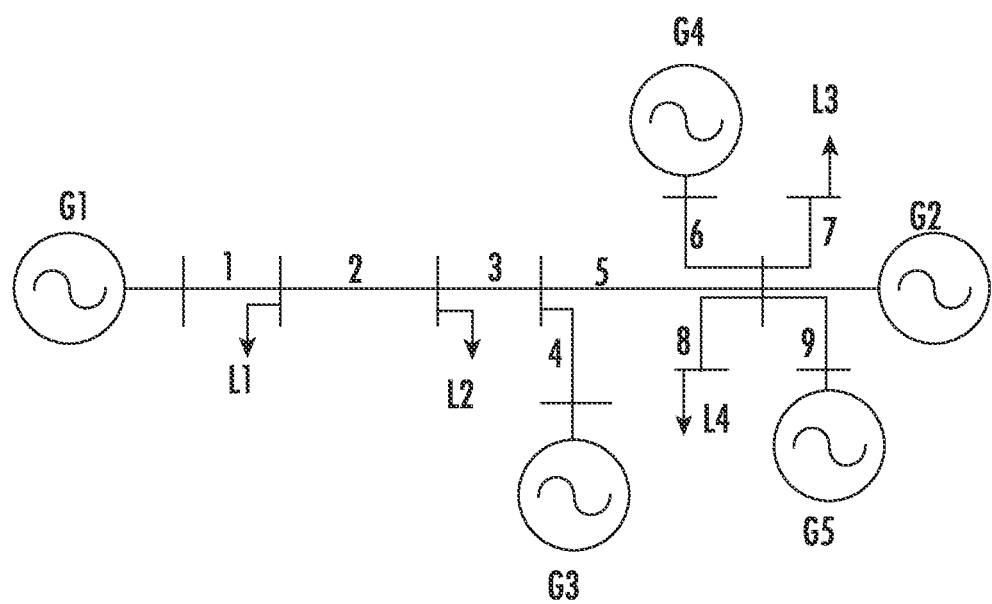
FIG. 6 is an example power system.
Figure 7:
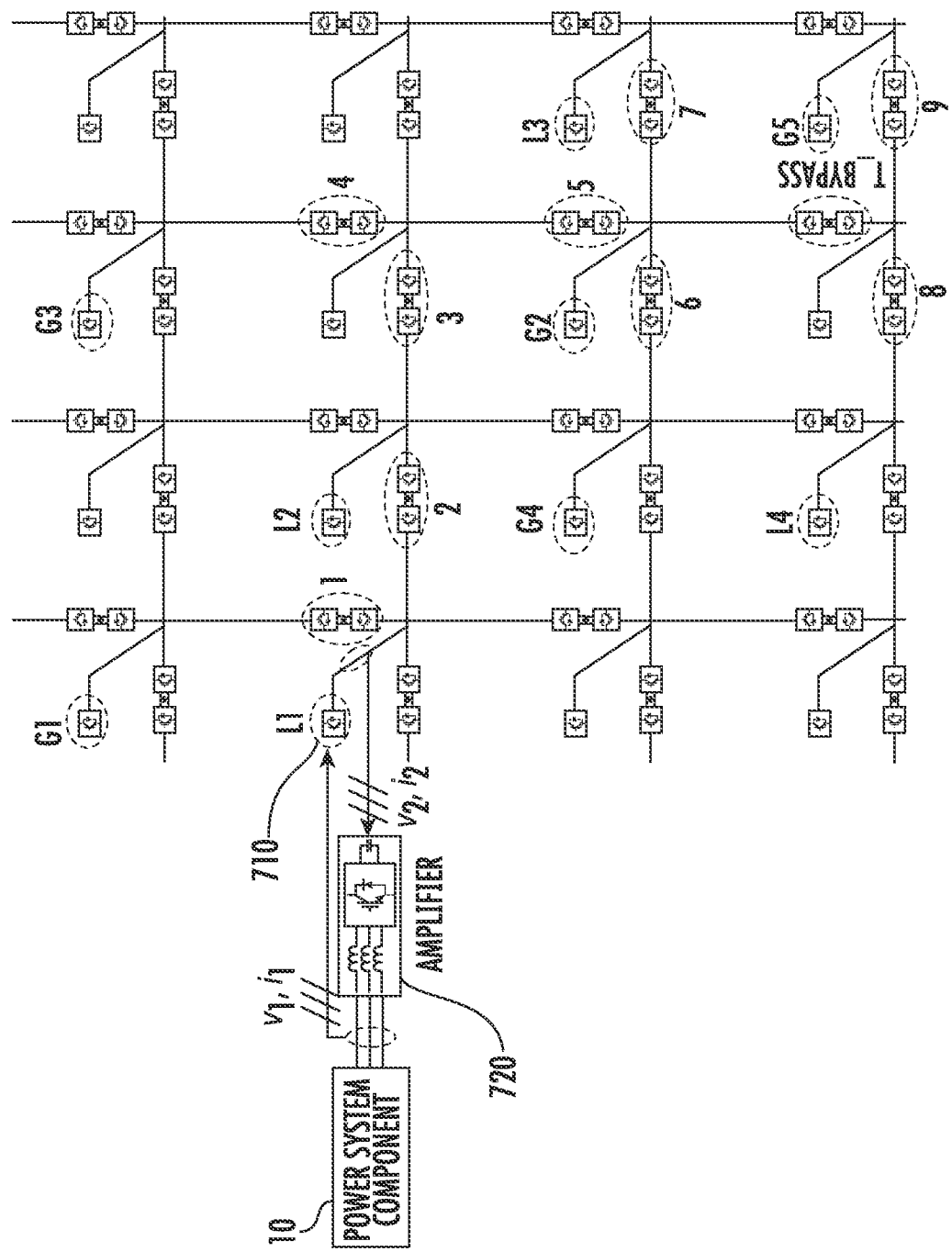
FIG. 7 illustrates testing a power system component using a power system emulator based test apparatus according to some embodiments.

FIG. 6 illustrates a power transmission system including generators G1, G2, G3, G4, G5, loads L1, L2, L3, L4, and interconnecting transmission lines 1-9. Referring to FIG. 7, such a system may be emulated using interconnected component emulator circuits of power system emulator apparatus along the lines described in the aforementioned U.S. patent application Ser. No. 17/150,650. According to some embodiments of the inventive subject matter, a component emulator 710 corresponding to the load L1 is controlled responsive to output voltage and current signals $v_1$, $i_1$ representing states of a power system component 10. In particular, an output current $i_2$ of the component emulator 710 is controlled to follow the power system component output current $i_1$. An amplifier circuit 720 coupled to the system component 10 is controlled responsive to voltage and current signals $v_2$, $i_2$ representative of states of the component emulator 710. In particular, the amplifier circuit 720 is controlled such that its output voltage $v_1$ follows the voltage $v_2$ of the component emulator 710 corresponding to the load L1.

Figure 8:
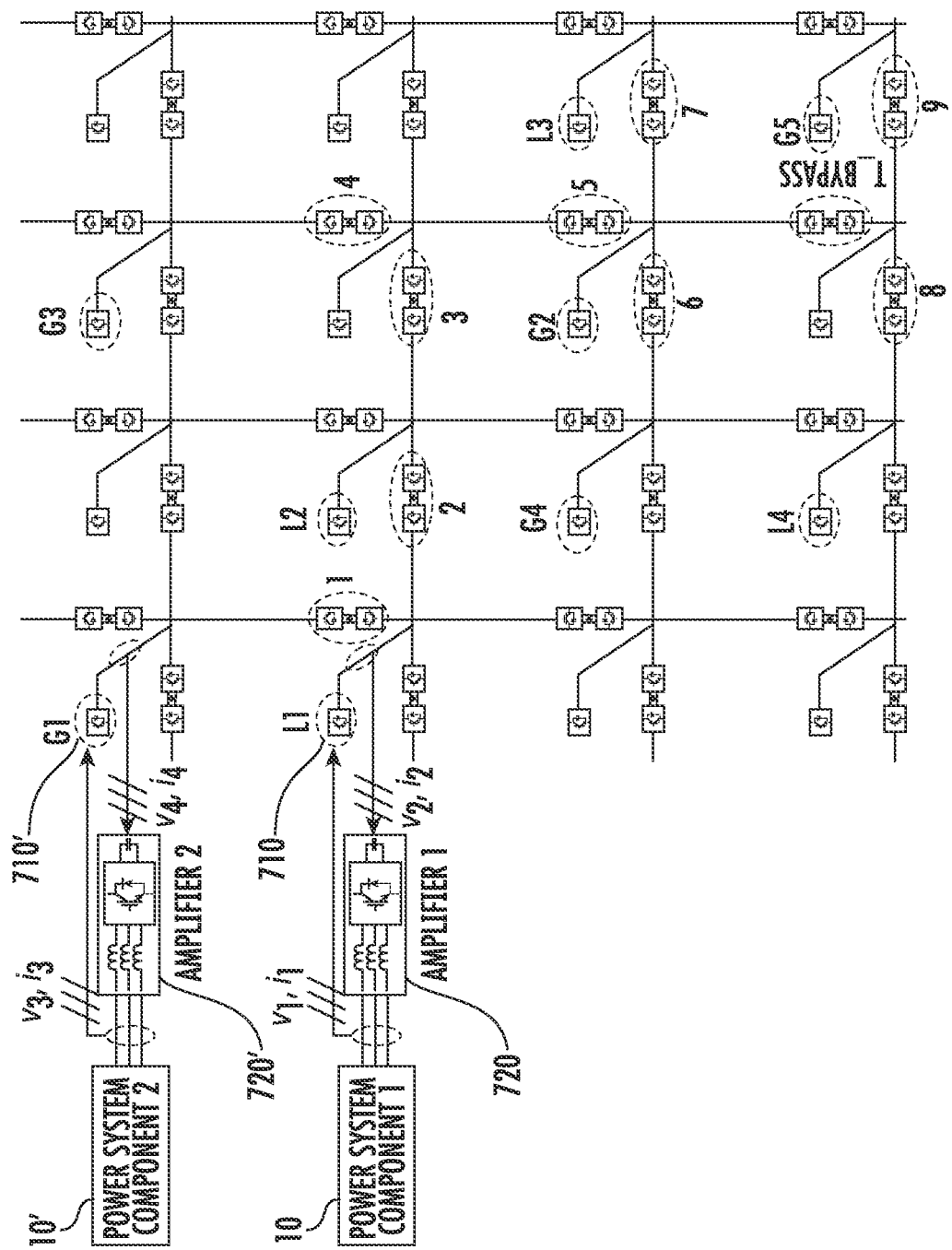
FIG. 8 illustrates testing two power system components with a power system emulator based test apparatus according to further embodiments.

FIG. 8 illustrates arrangement for testing two power system components according to further embodiments, testing in the power transmission system in FIG. 6. Along the lines discussed above with reference to FIG. 7, a first component emulator 710 corresponding to the load L1 is controlled responsive to output voltage and current signals $v_1$, $i_1$ representing states of a first power system component 10 corresponding to the load L1, such that an output current $i_2$ of the first component emulator 710 follows the power system component output current $i_1$. A first amplifier circuit 720 coupled to the system component 10 is controlled responsive to voltage and current signals $v_2$, $i_2$ representative of states of the first component emulator 710, such that the output voltage $v_1$ of the first amplifier circuit 720 follows the voltage $v_2$ of the first component emulator 710 corresponding to the load L1.

Similarly, a second component emulator 710' corresponding to the generator G1 is controlled responsive to output voltage and current signals $v_3$, $i_3$ representing states of a second power system component 10' corresponding to the generator G1, such that the second power system component output current $i_3$ follows an output current $i_4$ of the second component emulator 710'. A second amplifier circuit 720' coupled to the second system component 10' is controlled responsive to voltage and current signals $v_4$, $i_4$ representative of states of the second component emulator 710', such that the voltage $v_4$ of the second component emulator 710' corresponding to the generator G1 follows the output voltage $v_3$ of the second amplifier circuit 720'.

The drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus for testing a component for use in a power system, the apparatus comprising:
   at least one power amplifier circuit configured to be coupled to the component; and
   a control circuit configured to operate the power amplifier circuit responsive to at least one state of a component emulator for the component included in a system emulator for the power system, wherein the component emulator comprises a first component emulator circuit that is electrically coupled to at least one second component emulator circuit and wherein the first component emulator circuit and the at least one second component emulator circuit are included in power system emulator comprising a plurality of electrically interconnected component emulator circuits.

2. The apparatus of claim 1, wherein the component emulator comprises at least one power electronics converter circuit.

3. The apparatus of claim 2, wherein the control circuit is configured to control at least one of a voltage and a current of the at least one power amplifier circuit responsive to at least one of a voltage and a current of the at least one power electronics converter circuit.

4. The apparatus of claim 2, wherein the component comprises a multi-port component and wherein the at least one power electronics converter circuit comprises at least two power electronics converter circuits.

5. An apparatus for testing a component for use in a power system, the apparatus comprising:
   at least one power amplifier circuit configured to be coupled to the component; and a control circuit configured to operate the power amplifier circuit responsive to at least one state of a component emulator for the component included in a system emulator for the power system,
   wherein the control circuit is configured to control the component emulator responsive to at least one state of the at least one power amplifier circuit, wherein the component emulator comprises at least one power electronics converter circuit, and wherein the control circuit is configured to control at least one of a voltage and a current of the at least one power electronics converter circuit responsive to at least one of a voltage and a current of the at least one power amplifier circuit.

6. The apparatus of claim 5, wherein the component emulator comprises a multi-port component emulator and wherein the at least one power electronics converter circuit comprises at least two power electronics converter circuits.

7. A method of testing a component for use in a power system, the method comprising:
   coupling at least one power amplifier circuit to the component;
   operating the power amplifier circuit responsive to at least one state of a component emulator for the component included in a system emulator for the power system; and
   controlling the component emulator responsive to at least one state of the at least one power amplifier circuit by controlling at least one power electronics converter circuit, wherein controlling at least one power electronics converter circuit comprises controlling at least one of a voltage and a current of the at least one power electronics converter circuit responsive to at least one of a voltage and a current of the at least one power amplifier circuit.

8. The method of claim 7, wherein operating at least one power electronics converter circuit comprises controlling at least one of a voltage and a current of the at least one power amplifier circuit responsive to at least one of a voltage and a current of the at least one power electronics converter circuit.

9. The method of claim 7, wherein the component emulator comprises a multi-port component emulator and wherein the at least one power electronics converter circuit comprises at least two power electronics converter circuits.

10. The method of claim 7, wherein the component emulator comprises a first component emulator circuit and further comprising at least one second component emulator circuit electrically coupled to the first component emulator circuit.

11. The method of claim 10, wherein the first component emulator circuit and the at least one second component emulator circuit are included in power system emulator comprising a plurality of electrically interconnected component emulator circuits.

\* \* \* \* \*